US008857559B2

(12) United States Patent
Reviel

(10) Patent No.: US 8,857,559 B2
(45) Date of Patent: Oct. 14, 2014

(54) SPEAKER CABINET AND METHOD FOR FABRICATION

(76) Inventor: Chris Reviel, Watauga, TX (US)

( * ) Notice: Subject to any disclaimer, the term of this patent is extended or adjusted under 35 U.S.C. 154(b) by 0 days.

(21) Appl. No.: 13/495,900

(22) Filed: Jun. 13, 2012

(65) Prior Publication Data

US 2012/0318607 A1 Dec. 20, 2012

Related U.S. Application Data

(60) Provisional application No. 61/496,811, filed on Jun. 14, 2011.

(51) Int. Cl.

| | |
|---|---|
| ***H05K 5/02*** | (2006.01) |
| ***H04R 1/02*** | (2006.01) |
| ***H04R 1/28*** | (2006.01) |
| ***H04R 31/00*** | (2006.01) |
| ***H04R 1/26*** | (2006.01) |
| *H05K 5/00* | (2006.01) |
| *H04R 1/00* | (2006.01) |
| *H04R 3/14* | (2006.01) |

(52) U.S. Cl.
CPC .................. *H04R 1/26* (2013.01); *H04R 1/288* (2013.01); *H04R 31/00* (2013.01); *H04R 3/14* (2013.01); *H04R 2201/029* (2013.01)
USPC ............ 181/151; 181/146; 181/199; 381/345

(58) Field of Classification Search
USPC .......... 181/151, 148, 146, 150, 199; 381/345, 381/353, 354
See application file for complete search history.

(56) References Cited

U.S. PATENT DOCUMENTS

| | | | | | |
|---|---|---|---|---|---|
| 3,275,100 | A | * | 9/1966 | Dunning | 381/348 |
| 3,430,728 | A | * | 3/1969 | Dunning | 381/348 |
| 3,473,625 | A | * | 10/1969 | Heisrath | 381/336 |
| 3,720,285 | A | * | 3/1973 | Russell et al. | 181/151 |
| 3,867,996 | A | * | 2/1975 | Lou | 181/148 |
| 3,985,200 | A | * | 10/1976 | Sepmeyer | 181/150 |
| 4,161,995 | A | * | 7/1979 | Pohlmann et al. | 181/150 |
| 4,281,738 | A | * | 8/1981 | Jackson | 181/151 |
| 4,312,258 | A | * | 1/1982 | Park | 84/743 |
| 4,592,444 | A | * | 6/1986 | Perrigo | 181/151 |
| 4,596,305 | A | * | 6/1986 | Jagborn | 181/151 |
| 4,802,551 | A | * | 2/1989 | Jacobsen | 181/146 |
| 4,869,340 | A | * | 9/1989 | Coudoux | 181/146 |
| 4,964,482 | A | * | 10/1990 | Meyer | 181/146 |
| 5,046,104 | A | * | 9/1991 | Kloss | 381/335 |
| 5,115,884 | A | * | 5/1992 | Falco | 181/156 |
| 5,194,701 | A | * | 3/1993 | Yamada-Scriba | 181/151 |
| 5,333,204 | A | * | 7/1994 | Hamada et al. | 381/346 |
| 5,866,858 | A | * | 2/1999 | Dewey | 181/151 |
| 5,979,591 | A | * | 11/1999 | Harrison | 181/199 |
| 6,073,723 | A | * | 6/2000 | Gallo | 181/151 |

(Continued)

*Primary Examiner* — Edgardo San Martin

(57) ABSTRACT

A speaker cabinet includes an outer shell, at least one inner shell, and a core material. The outer shell includes high tensile strength material and includes at least one aperture. The at least one inner shell includes high tensile strength material and includes an aperture configured to accept an audio driver. Each of the at least one inner shell corresponds to one of the at least one aperture of the outer shell. The core material includes a vibration absorbing material. The aperture of each inner shell is positioned adjacent to the corresponding aperture of the outer shell. Each inner shell is held in position by the core material, and each inner shell does not make direct mechanical contact with the outer shell.

20 Claims, 5 Drawing Sheets

(56) References Cited

U.S. PATENT DOCUMENTS

| | | | | |
|---|---|---|---|---|
| 6,705,426 | B2 * | 3/2004 | Copetti | 181/155 |
| 6,896,097 | B2 * | 5/2005 | Nishikawa et al. | 181/199 |
| 7,207,413 | B2 * | 4/2007 | Plummer | 181/199 |
| 7,614,479 | B2 * | 11/2009 | Plummer | 181/199 |
| 2009/0211840 | A1 * | 8/2009 | Jiang | 181/199 |

* cited by examiner

SPEAKER CABINET AND METHOD FOR FABRICATION

CROSS-REFERENCE TO RELATED APPLICATION

This application claims priority under 35 USC 119(e) to U.S. provisional Application Ser. No. 61/496,811, filed on Jun. 14, 2011, and which is incorporated herein by reference.

TECHNICAL FIELD

This disclosure relates generally to speaker cabinets. More specifically, this disclosure relates to a speaker cabinet fabricated using molded materials.

BACKGROUND

Sound transducers (or drivers) are typically mounted within an enclosure to control characteristics of sound produced by the transducer.

SUMMARY

This disclosure provides an apparatus and method for a speaker cabinet formed from molded materials.

According to one embodiment of the present disclosure, a speaker cabinet is provided. The speaker cabinet includes an outer shell, at least one inner shell, and a core material. The outer shell includes high tensile strength material and includes at least one aperture. The at least one inner shell includes high tensile strength material and includes an aperture configured to accept an audio driver. Each of the at least one inner shell corresponds to one of the at least one aperture of the outer shell. The core material includes a vibration absorbing material. The aperture of each inner shell is positioned adjacent to the corresponding aperture of the outer shell. Each inner shell is held in position by the core material, and each inner shell does not make direct mechanical contact with the outer shell.

In another embodiment, a method of making a speaker cabinet is provided. The method includes forming at least one inner shell comprising high tensile strength material and having an aperture configured to accept an audio driver. The method also includes forming an outer shell comprising high tensile strength material and having at least one aperture. The method further includes placing each of the at least one inner shell inside the outer shell and aligning the at least one inner shell with a corresponding one of the at least one aperture of the outer shell. The method still further includes pouring a core material inside the outer shell, the core material comprising a vibration absorbing material that substantially fills a cavity of the outer shell and surrounds each of the at least one inner shell. Each inner shell is held in position by the core material, and each inner shell does not make direct mechanical contact with the outer shell.

In still another embodiment, a speaker system is provided. The speaker system includes an outer shell, at least one inner shell, at least one audio driver, and a core material. The outer shell includes high tensile strength material and includes at least one aperture. The at least one inner shell includes high tensile strength material and includes an aperture. Each of the at least one inner shell corresponds to one of the at least one aperture of the outer shell. Each audio driver is mounted in a corresponding aperture of each of the at least one inner shell.

The core material includes a vibration absorbing material. The aperture of each inner shell is positioned adjacent to the corresponding aperture of the outer shell. Each inner shell is held in position by the core material, and each inner shell does not make direct mechanical contact with the outer shell Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

The various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
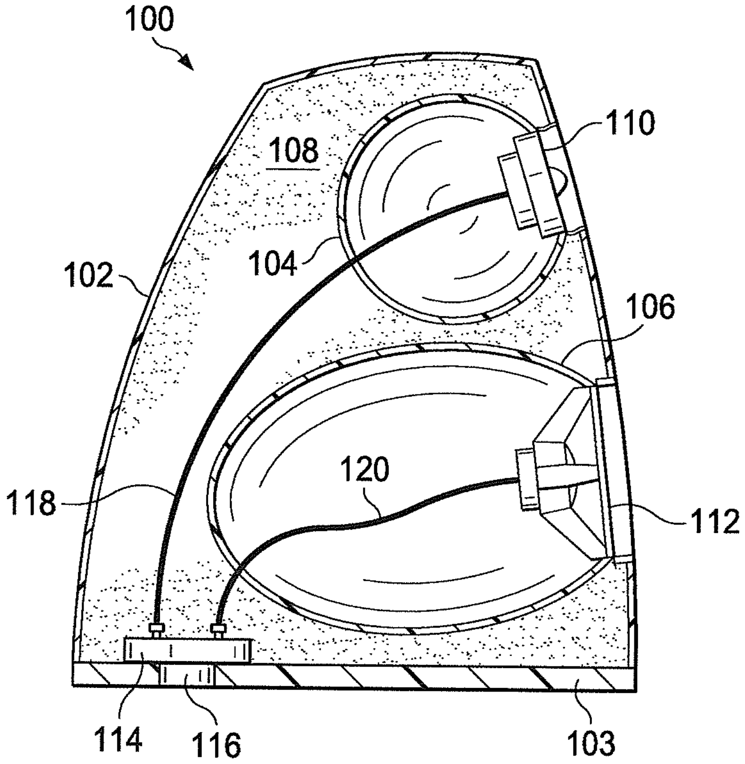
FIGS. 1A and 1B illustrate side and front views of a speaker cabinet according to this disclosure.

FIG. 1A illustrates a cross-sectional, schematic, side view of a speaker cabinet 100 according to this disclosure. The embodiment of the speaker cabinet 100 shown in FIG. 1A is for illustration only. Other embodiments of the speaker cabinet 100 may be used without departing from the scope of this disclosure.

In this example embodiment, the speaker cabinet 100 includes an outer shell 102, first inner shell 104, second inner shell 106, a base 103, and core material 108. A high-frequency driver 110 is mounted in an opening of the first inner shell 104. A rim of the driver 110 seals the first inner shell 104 to form an airtight container. A low-frequency driver 112 is mounted in an opening of the second inner shell 106. A rim of the driver 112 seals the second inner shell 106 to form an airtight container.

As will be explained in greater detail with reference to FIG. 3, the first inner shell 104 (and the driver 110) and the second inner shell 106 (and the driver 112) are not in contact with the outer shell 102. The inner shells 104 and 106 are held in positions adjacent to corresponding first and second openings in the outer shell 102 by the core material 108. The core material 108 absorbs vibrations produced in the inner shells 104 and 108 by their associated drivers 110 and 112, respectively, and reduces coupling of such vibrations to the outer shell 102, thereby reducing effects of vibration of the outer shell 102 on the sound produced by the drivers 110 and 112.

The speaker cabinet 100 further includes a cross-over/connector assembly 114. In FIG. 1A, the assembly 114 is shown mounted in the base 103, however it will be understood that the assembly 114 may be mounted in any exterior wall of the speaker cabinet 100. The assembly 114 includes a connector 116 configured to be accessed from the exterior of the speaker cabinet 100 and configured to electrically couple to, and receive an audio input signal from, an amplifier or other sound source.

The assembly 114 also includes a crossover network (not shown in FIG. 1A), which is an electrical circuit that separates the audio signal received at the connector 116 into a high-frequency component and a low-frequency component. The high-frequency component is carried by an electrical conductor 118 to the high-frequency driver 110. The low-frequency component is carried by an electrical conductor 120 to the low-frequency driver 112. The conductors 118 and 120 pass through the core material 108 and walls of the first and second inner shells 104 and 106, respectively. The holes in the inner shells 104 and 106 through which the conductors 118 and 120 pass are sealed to maintain the first and second inner shells 104 and 106 as airtight containers.

The first inner shell 104 has a spherical shape. The second inner shell 106 has an oblate shape with a circular cross-section. The inner shells 104 and 106 have shapes and internal volumes that are based on desired frequency ranges and other audio characteristics of the respective drivers 110 and 112, as will be explained in greater detail below.

The outer shell 102 and the first and second inner shells 104 and 106 are made of one or more high tensile strength materials, such as Aramid, carbon fiber, fiberglass, Kevlar, spun aluminum, or any other suitable material. The base 103 may be made of a similar material or of wood or metal.

In some embodiments, the inner shells 104 and 106 are formed using an inflatable mandrel on which is wrapped a reinforcement material in a resin matrix. In other embodiments, the inner shells 104 and 106 are formed by a metal spinning process (e.g., spun aluminum). In still other embodiments, the inner shells 104 and 106 are formed from a material that can be blow-molded or rotationally molded into a desired shape and then wrapped with a reinforcement material in a resin matrix. One of the inner shells may be formed using one such technique and the other formed using another such technique.

Suitable materials for the reinforcement material for the outer shell 102 and the inner shells 104 and 106 include carbon fiber, fiberglass, aluminum, glass and carbon fiber, Kevlar, Aramid, or other such materials. Suitable materials for a resin matrix for the outer shell 102 and the inner shells 104 and 106 include polyester vinylester, epoxy, phenolic, polyimide, polyamide, polypropylene, Peek, or other such materials. The outer shell 102 and the inner shells 104 and 106 may be formed using any suitable, desired combination of reinforcement material and resin matrix. The outer shell 102 and the inner shells 104 and 106 may be formed using different combinations of reinforcement material and resin matrix.

The core material 108 is made of a material that absorbs vibrations and has mild adhesive properties, in order to bind the core material 108 to the outer shell 102 and the inner shells 104 and 106. As will be explained in greater detail later, after the outer shell 102 and the inner shells 104 and 106 are formed, the outer shell 102 is positioned upside down and the inner shells 104 and 106 are held in desired positions relative to the outer shell 102. The core material 108, in a fluid form, is poured into the outer shell to surround the inner shells 104 and 106. As the core material 108 cures, it expands into a foam that substantially fills any remaining space within the outer shell 102 not already filled by the inner shells 104 and 106. The foam core material 108 provides desired vibration-absorbing and adhesive characteristics.

Suitable materials for the core material 108 include high-density urethane, epoxy with fillers, phenolic, and other such materials.

Figure 1B:
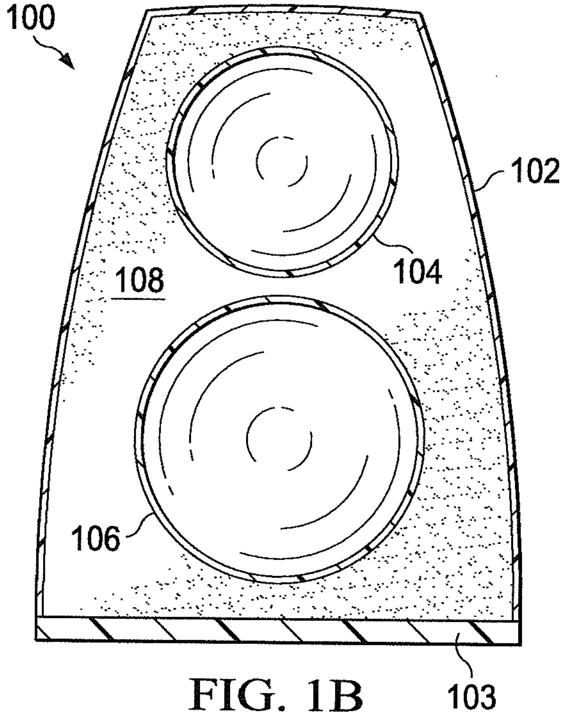

FIG. 1B presents a cross-sectional, schematic, front view of the speaker cabinet 100, wherein like numbers designated like objects in FIG. 1A.

Figure 2A:
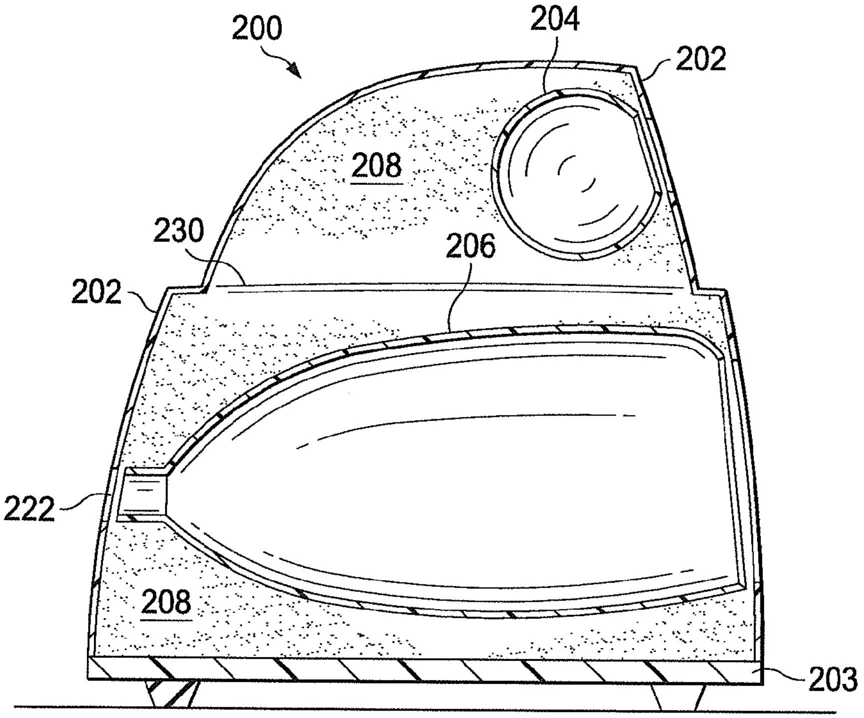
FIGS. 2A and 2B illustrate side and front views of a second speaker cabinet according to this disclosure.

FIG. 2A illustrates a cross sectional, schematic, side view of a second speaker cabinet 200 according to this disclosure. The embodiment of the speaker cabinet 200 shown in FIG. 2A is for illustration only. Other embodiments of the speaker cabinet 200 may be used without departing from the scope of this disclosure.

The speaker cabinet 200 includes an outer shell 202, a first inner shell 204, a second inner shell 206, and a base 203. In some embodiments, reference character 230 indicates an outer surface contour of the outer shell 202 and does not include a partition between upper and lower portions of the volume enclosed by the outer shell 202. The volume enclosed by the outer shell 202 is filled by core material 208.

The first inner shell 204 is spherical and fully enclosed. The second inner shell 206 is oblate, with a circular cross-section, and has a port 222 that acoustically couples the second inner shell 206 to the exterior of the outer shell 202. A length, diameter, and other physical characteristics of the port 222 are selected to produce desired audio characteristics in sound produced by a driver mounted in the second inner shell 206.

Figure 2B:
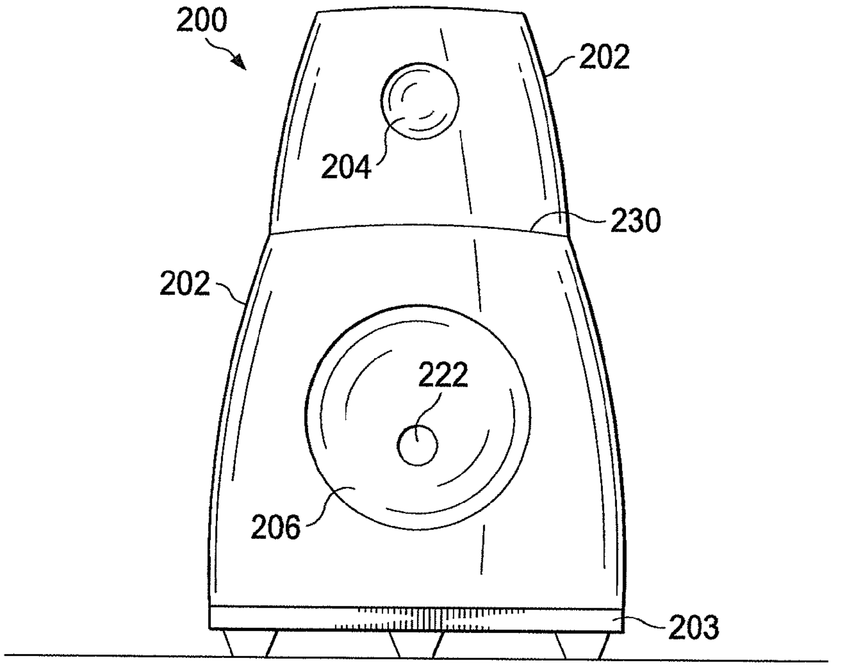

FIG. 2B presents a cross-sectional, schematic, front view of the speaker cabinet 200, wherein like numbers designated like objects in FIG. 2A.

Figure 3:
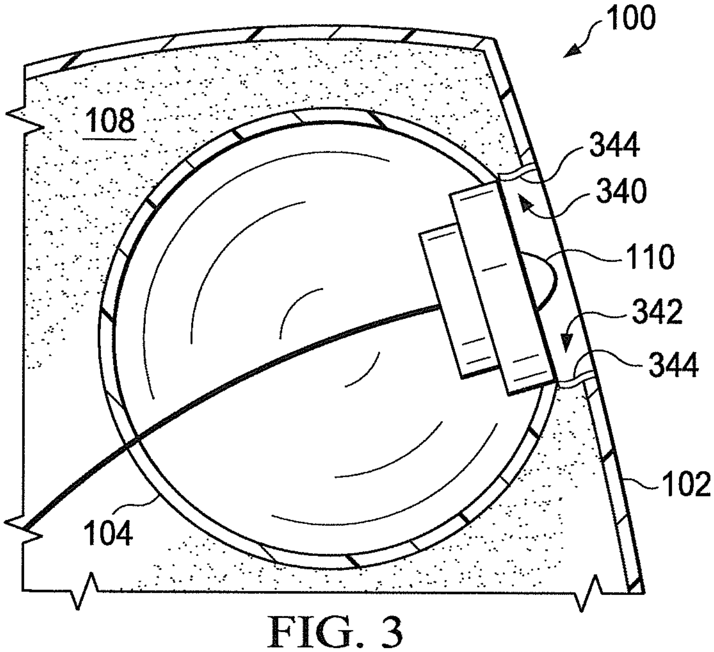
FIG. 3 illustrates a side detail view of a portion of the speaker cabinet of FIG. 1A according to this disclosure.

FIG. 3 illustrates a cross-sectional, schematic, side detail view of a portion of the speaker cabinet 100 according to this disclosure. The embodiment of the speaker cabinet 100 shown in FIG. 3 is for illustration only. Other embodiments of the speaker cabinet 100 may be used without departing from the scope of this disclosure.

In FIG. 3, it may be seen that the first inner shell 104 and its associated driver 110 do not contact the outer shell 102 and are held in place by the core material 108. As such, the core material 108 may be visible from outside the outer shell 102 through gaps or openings 340 and 342 between the first inner shell 104 and the outer shell 102. In some embodiments, a compliant material 344 (e.g., a fabric) may be placed over the visible portions of the core material 308 to provide a desired visual effect without mechanically coupling the first inner shell 104 and the driver 110 to the outer shell 102, which could result in undesirable transmission of vibrations to the outer shell 102.

Figure 4:
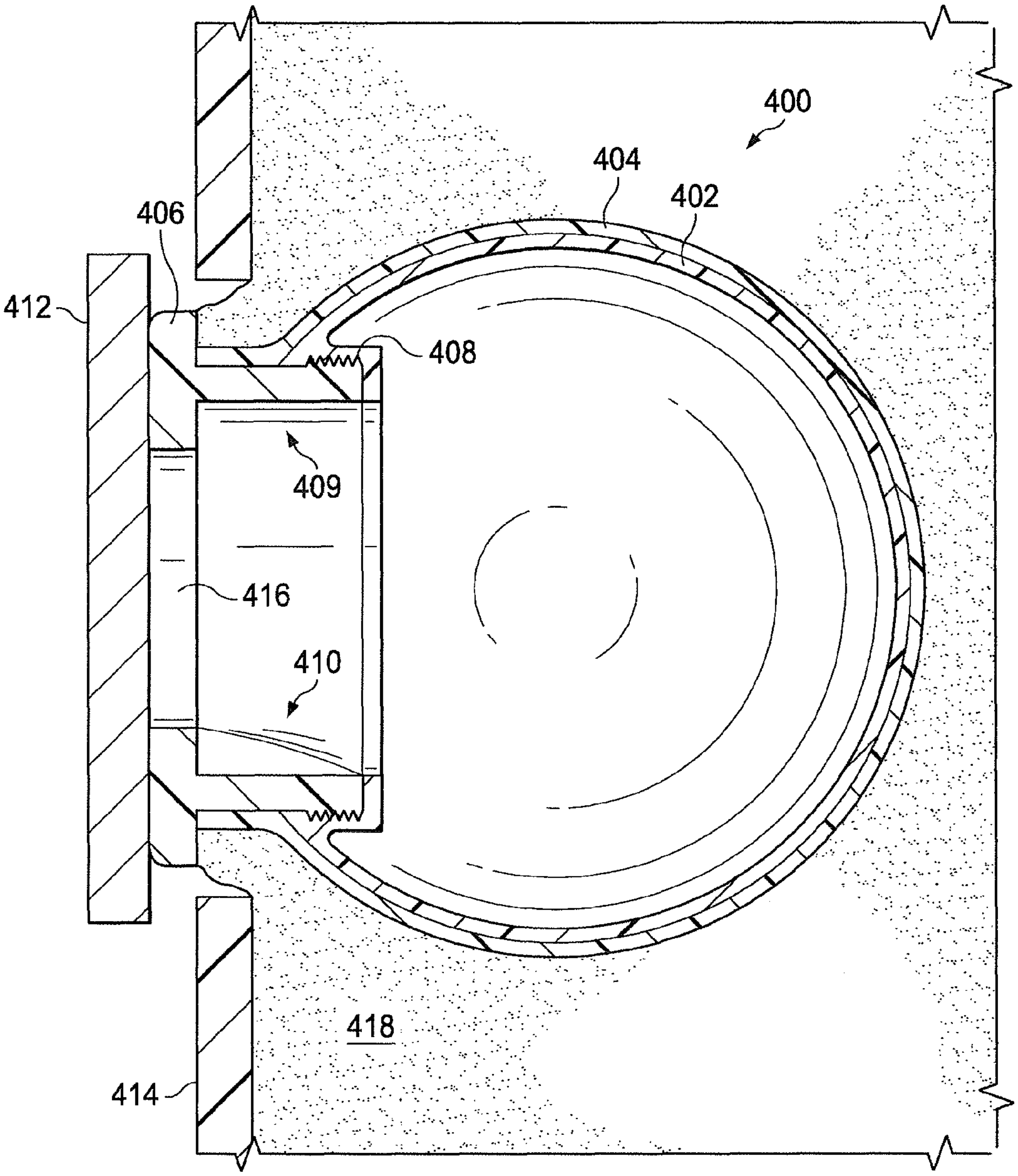
FIG. 4 depicts a cross-sectional side view of an inner shell according to this disclosure.

FIG. 4 depicts a cross-sectional side view of an inner shell 400 according to this disclosure. The embodiment of the inner shell 400 shown in FIG. 4 is for illustration only. Other embodiments of the inner shell 400 may be used without departing from the scope of this disclosure.

The shell 400 includes an integral mounting plate 406 with a ribbed interface structure 408, around which is molded a shell 402 having a desired shape and volume. The shell 402 is molded around the ribbed interface structure 408 to form a unitary structure. A structure 404 of glass-on-carbon (or other high tensile strength material) is formed around the shell 402 and integral mounting plate 406, to add stiffness to the shell 400. The integral mounting plate 406 may have an inner contour 409, an inner contour 410, or other suitable contour.

A driver may mount to the inner shell 400 via a mounting plate 412 and extend (not shown) into the interior of the inner shell 400 through an aperture 416. The inner shell 400 may be positioned adjacent to an opening in an outer shell 414 and held in position by core material 418.

In another embodiment, the shell 402 is a spun aluminum shell, around which a fiberglass layer 404 is formed. In this embodiment, the shell 402 is not formed around a ribbed interface structure 408. Instead, the integral mounting plate 406 and/or the driver mounting plate 412 may fasten directly to the shell 402.

Figure 5:
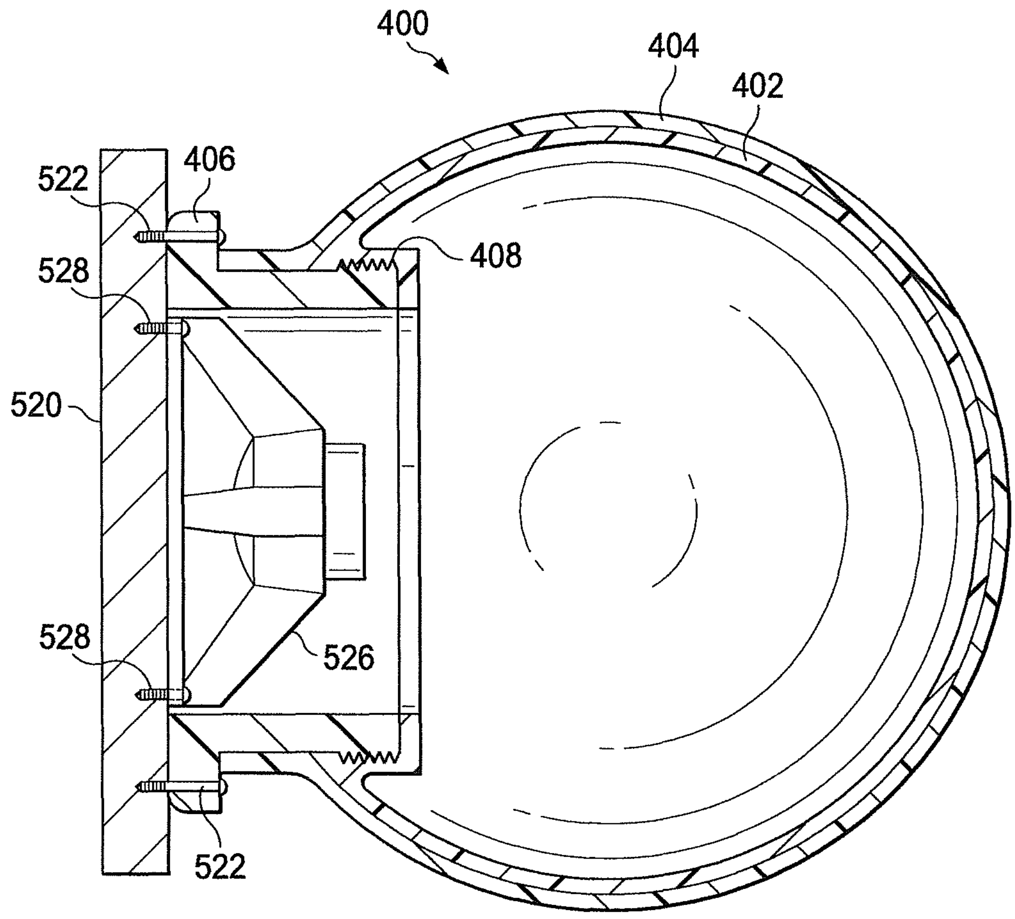
FIG. 5 depicts a cross-sectional side view of an alternate driver mounting configuration for the inner shell according to this disclosure.

FIG. 5 depicts a cross-sectional side view of an alternate driver mounting configuration for the inner shell 400 according to this disclosure. The embodiment of the inner shell 400 shown in FIG. 5 is for illustration only. Other embodiments of the inner shell 400 may be used without departing from the scope of this disclosure.

A driver mounting plate 520 may be mounted to the integral mounting plate 406 by connectors 522. The connectors 522 may be machine screws, sheet metal screws, pop rivets, or any other suitable connector. A driver 526 may be mounted to an inner or back side of the driver mounting plate 520 by hidden connectors 528. Connectors 528 may be threaded studs, sheet metal screws, or any other suitable connector that is not visible from the outer or front side of the driver mounting plate 520.

A volume of inner shells according to the disclosure may be based upon recommended volumes provided by driver manufacturers or may be calculated according to Thiele/Small electro mechanical parameters.

A speaker cabinet according to the disclosure includes at least one inner shell, the inner shell configured to match any of a plurality of drivers (different shape per driver) installed in the cabinet. Such a speaker cabinet absorbs at least some unwanted energy and reduces cabinet resonance, so that the drivers operate with significantly reduced interference from the cabinet.

Because the outer shell of the speaker cabinet is separated from the inner shell(s) by an expandable core material, the outer shell can be formed in nearly any shape. This gives the speaker manufacturer great flexibility in design. In particular, the shape of the outer shell can be selected to minimize edge diffraction effects in the audio output of the driver(s). Furthermore, the shape of the outer shell can be selected to be visually appealing or conform to certain design aesthetics.

Figure 6:
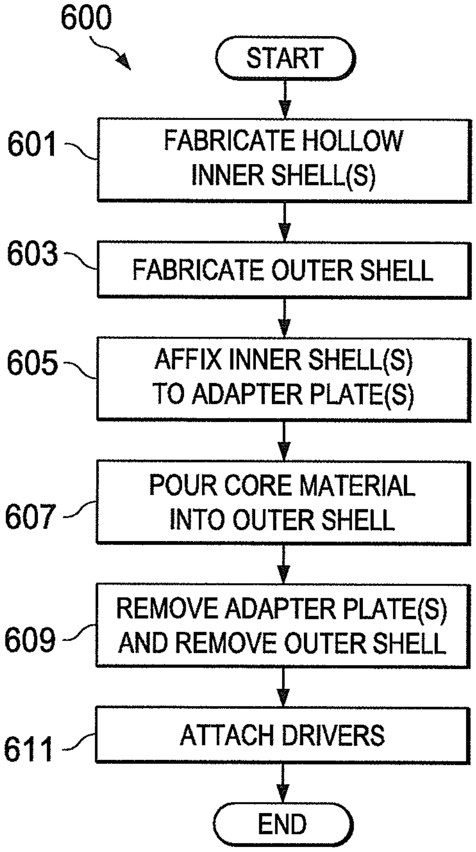
FIG. 6 depicts a method for fabricating a speaker cabinet according to the disclosure.

FIG. 6 depicts a method for fabricating a speaker cabinet according to the disclosure. The method shown in FIG. 6 is for illustration only. Other embodiments of the method could be used without departing from the scope of this disclosure.

In block 601, the hollow inner shell is fabricated. The hollow inner shell can be fabricated using one or more of the following techniques. In a first technique, the hollow shell is formed to a desired shape and volume using a metal spinning process, thereby creating a spun metal (e.g., spun aluminum) layer. The spun metal layer is then wrapped or covered with a fiberglass layer.

In a second technique, the hollow shell is formed using a rotational molding (or "roto-molding") process. Then the roto-molded plastic shell is wrapped with fiberglass or carbon fiber and a matrix material. In a third technique, the hollow shell is formed using a blow molding process. The second and third techniques may require an inner coating to deaden the shell.

In a fourth technique, the hollow inner shell is formed using an inflatable mandrel, which when inflated would be the desired shape and volume. While inflated, the mandrel is wrapped with fiberglass or carbon fiber and a matrix material. Then when cured, the mandrel is deflated and removed. In a fifth technique, the inner shell is formed around a destructible form made from wax, sand, or another suitable material.

In block 603, the outer shell is fabricated. In one embodiment, the outer shell is formed in a female mold by laying up fiberglass or carbon fiber with a matrix material. Once cured, the shell may remain in the mold during one or more later operations. Round holes may be formed in the outer shell where the speaker drivers will mount.

The mold for the outer shell may be cast or machined out of aluminum or steel with a uniform wall thickness that depends on the size of the outer shell (e.g., a larger outer shell would typically have a thicker wall). The wall of the mold includes one or more openings (one for each inner shell, as described below) that are larger than the aperture for the associated inner shell to be placed in the mold. Surrounding each opening is a pattern of threaded holes on the outside of the mold that match the hole pattern of an adapter plate. The adapter plate also has an inner hole pattern that matches threaded holes for mounting the driver to the inner shell. The adapter plate also has circular grooves for plastic seals or O-rings where the adapter plate attaches via bolts to the mold and the inner shell. The seals create an airtight seal when injecting the core material. The inner face of the adapter plate can be formed with a variable thickness to allow drivers to be offset from the surface of the outer composite shell.

In block 605, one or more hollow inner shells are affixed (e.g., by bolts) to the adapter plate that attaches to the outside of the mold. The inner shells are aligned with the openings in the wall of the mold that were formed in block 603. Because the inner and outer shells are only connected via the core material, the plastic seals or O-rings may be used to prevent leakage in the next operation. A wiring harness may be positioned in this operation.

In block 607, the core material (e.g., high-density polyurethane foam) is poured into the outer shell. A base plate (which may be permanent or temporary) is affixed to the mold from block 603. The plate has an injection hole and small vent holes. The proper amount of foam is then metered through the injection hole and quickly sealed with a plug. Then, the core material is allowed to cure fully.

In block 609, after the core material is cured, the adapter plates holding the inner shells are removed and the entire structure is removed from the outer shell female mold. In block 611, the drivers are installed.

Although FIG. 6 illustrates one example of a method 600 for fabricating a speaker cabinet, various changes may be made to FIG. 6. For example, the various operations described in FIG. 6 may overlap, occur in parallel, occur in a different order, or occur multiple times. Furthermore, one or more operations may be added to or removed from method 600.

It may be advantageous to set forth definitions of certain words and phrases used throughout this patent document. The term "couple" and its derivatives refer to any direct or indirect communication between two or more elements, whether or not those elements are in physical contact with one another. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "obtain" and its derivatives refer to any acquisition of data or other tangible or intangible item, whether acquired from an external source or internally (such as through internal generation of the item). The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A speaker cabinet comprising:

an outer shell comprising high tensile strength material and having at least one aperture;

at least one inner shell comprising high tensile strength material and having an aperture configured to accept an audio driver, each of the at least one inner shell corresponding to one of the at least one aperture of the outer shell; and a core material comprising a vibration absorbing material that fills a cavity of the outer shell, the vibration absorbing material configured to be poured inside the outer shell and cures to surround each of the at least one inner shell, wherein the aperture of each inner shell is positioned adjacent to the corresponding aperture of the outer shell, each inner shell is held in position by the core material, and each inner shell does not make direct mechanical contact with the outer shell.

2. The speaker cabinet of claim 1, wherein the core material comprises a rigid high-density urethane that maintains the position of each inner shell within the outer shell.

3. The speaker cabinet of claim 1, further comprising:

a fabric material disposed between the at least one inner shell and the corresponding aperture of the outer shell, the fabric material configured to cover an opening between the inner shell and the aperture.

4. The speaker cabinet of claim 1, wherein each of the at least one inner shell comprises:

a layer of aluminum; and a layer of fiberglass over the layer of aluminum.

5. The speaker cabinet of claim 1, wherein each of the at least one inner shell comprises a roto-molded plastic shell.

6. The speaker cabinet of claim 3, wherein only the core material and the fabric material connect each inner shell with the outer shell.

7. The speaker cabinet of claim 1, wherein the core material comprises a high-density urethane.

8. A method of making a speaker cabinet, the method comprising:

forming at least one inner shell comprising high tensile strength material and having an aperture configured to accept an audio driver;

forming an outer shell comprising high tensile strength material and having at least one aperture;

placing each of the at least one inner shell inside the outer shell and aligning the at least one inner shell with a corresponding one of the at least one aperture of the outer shell; and pouring a core material inside the outer shell, the core material comprising a vibration absorbing material that substantially fills a cavity of the outer shell and surrounds each of the at least one inner shell;

wherein each inner shell is held in position by the core material, and each inner shell does not make direct mechanical contact with the outer shell.

9. The method of claim 8, wherein the core material comprises a rigid high-density urethane that maintains the position of each inner shell within the outer shell.

10. The method of claim 8, further comprising:

attaching a fabric material between the at least one inner shell and the corresponding aperture of the outer shell, the fabric material configured to cover an opening between the inner shell and the aperture.

11. The method of claim 8, wherein each of the at least one inner shell comprises:

a layer of aluminum; and a layer of fiberglass over the layer of aluminum.

12. The method of claim 8, wherein each of the at least one inner shell comprises a roto-molded plastic shell.

13. The method of claim 10, wherein only the core material and the fabric material connect each inner shell with the outer shell.

14. The method of claim 8, wherein the core material comprises a high-density urethane.

15. A speaker system comprising:

an outer shell comprising high tensile strength material and having at least one aperture;

at least one inner shell comprising high tensile strength material and having an aperture, each of the at least one inner shell corresponding to one of the at least one aperture of the outer shell;

an audio driver mounted in the aperture of each of the at least one inner shell; and a core material comprising a vibration absorbing material that fills a cavity of the outer shell, the vibration absorbing material configured to be poured inside the outer shell and cures to surround each of the at least one inner shell, wherein the aperture of each inner shell is positioned adjacent to the corresponding aperture of the outer shell, each inner shell is held in position by the core material, and each inner shell does not make direct mechanical contact with the outer shell.

16. The speaker system of claim 15, further comprising:

a fabric material disposed between the at least one inner shell and the corresponding aperture of the outer shell, the fabric material configured to cover an opening between the inner shell and the aperture.

17. The speaker system of claim 15, wherein each of the at least one inner shell comprises:

a layer of aluminum; and a layer of fiberglass over the layer of aluminum.

18. The speaker system of claim 15, wherein each of the at least one inner shell comprises a roto-molded plastic shell.

19. The speaker system of claim 16, wherein only the core material and the fabric material connect each inner shell with the outer shell.

20. The speaker system of claim 15, wherein the core material comprises a high-density urethane.

* * * * *